(12) United States Patent
Wang et al.

(10) Patent No.: US 10,867,827 B2
(45) Date of Patent: Dec. 15, 2020

(54) ALIGNMENT HOLDER, TESTING APPARATUS AND METHOD FOR MANUFACTURING A SEMICONDUCTOR PACKAGE

(71) Applicant: Taiwan Semiconductor Manufacturing Co., Ltd., Hsinchu (TW)

(72) Inventors: Chih Wang, Hsinchu (TW); Hung-Jui Kuo, Hsinchu (TW); Hui-Jung Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/392,599

(22) Filed: Apr. 23, 2019

(65) Prior Publication Data

US 2020/0105567 A1 Apr. 2, 2020

Related U.S. Application Data

(60) Provisional application No. 62/737,114, filed on Sep. 27, 2018.

(51) Int. Cl.
| | | |
|---|---|---|
| *H01L 21/68* | (2006.01) | |
| *H01L 21/66* | (2006.01) | |
| *H01L 21/56* | (2006.01) | |
| *H01L 21/687* | (2006.01) | |

(52) U.S. Cl.
CPC ............ *H01L 21/68* (2013.01); *H01L 21/565* (2013.01); *H01L 21/68728* (2013.01); *H01L 22/12* (2013.01); *H01L 22/26* (2013.01); *H01L 22/30* (2013.01)

(58) Field of Classification Search
CPC ....... H01L 21/68; H01L 22/12; H01L 21/565; H01L 22/30; H01L 21/68728; H01L 22/26; H01L 23/3128; H01L 21/67253; H01L 24/00; G01N 3/04
See application file for complete search history.

(56) References Cited

U.S. PATENT DOCUMENTS

| | | | | |
|---|---|---|---|---|
| 2009/0120589 A1* | 5/2009 | Kang | ...................... | H01L 24/80 156/539 |
| 2009/0283220 A1* | 11/2009 | Chen | ...................... | H01L 24/75 156/566 |
| 2018/0342408 A1* | 11/2018 | Priewasser | .......... | H01L 21/6836 |

\* cited by examiner

*Primary Examiner* — Mohammed R Alam
(74) *Attorney, Agent, or Firm* — JCIPRNET

(57) ABSTRACT

An alignment holder for holding and testing a composite specimen includes a holder body, a supporter, and a positioning mechanism. The holder body is configured to clamp a first side of the composite specimen. The supporter is detachably connected to a lower part of the holder body for supporting a lower surface of the composite specimen. The positioning mechanism is configured to lean against a second side of the composite specimen and move relatively to the holder body for adjusting a clamping position of the composite specimen clamped by the holder body.

15 Claims, 9 Drawing Sheets

ALIGNMENT HOLDER, TESTING APPARATUS AND METHOD FOR MANUFACTURING A SEMICONDUCTOR PACKAGE

CROSS-REFERENCE TO RELATED APPLICATION

This application claims the priority benefit of U.S. provisional application Ser. No. 62/737,114, filed on Sep. 27, 2018. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

In molded electronic and electric parts containing inserting components such as encapsulated semiconductor devices and resin insulating transformers, the interface between the resin and the inserting component subjected to high residual stress due to the cure shrinkage of the resin and the coefficient of the thermal expansion mismatch between the resin and the inserting components. These thermal stress sometimes causes delamination during operations of the components and reliability tests Such a delamination at adhering interfaces not only results in corrosion of electric wiring materials and electric insulating degradation, but also causes a variety of other damages, such as cracking of the resin and wire breaking due to the stress concentration by the delamination. Therefore, the evaluation of bonding strength of a composite structure is therefore a critical issue in assuring the reliability of such composite structure.

BRIEF DESCRIPTION OF THE DRAWINGS

The aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
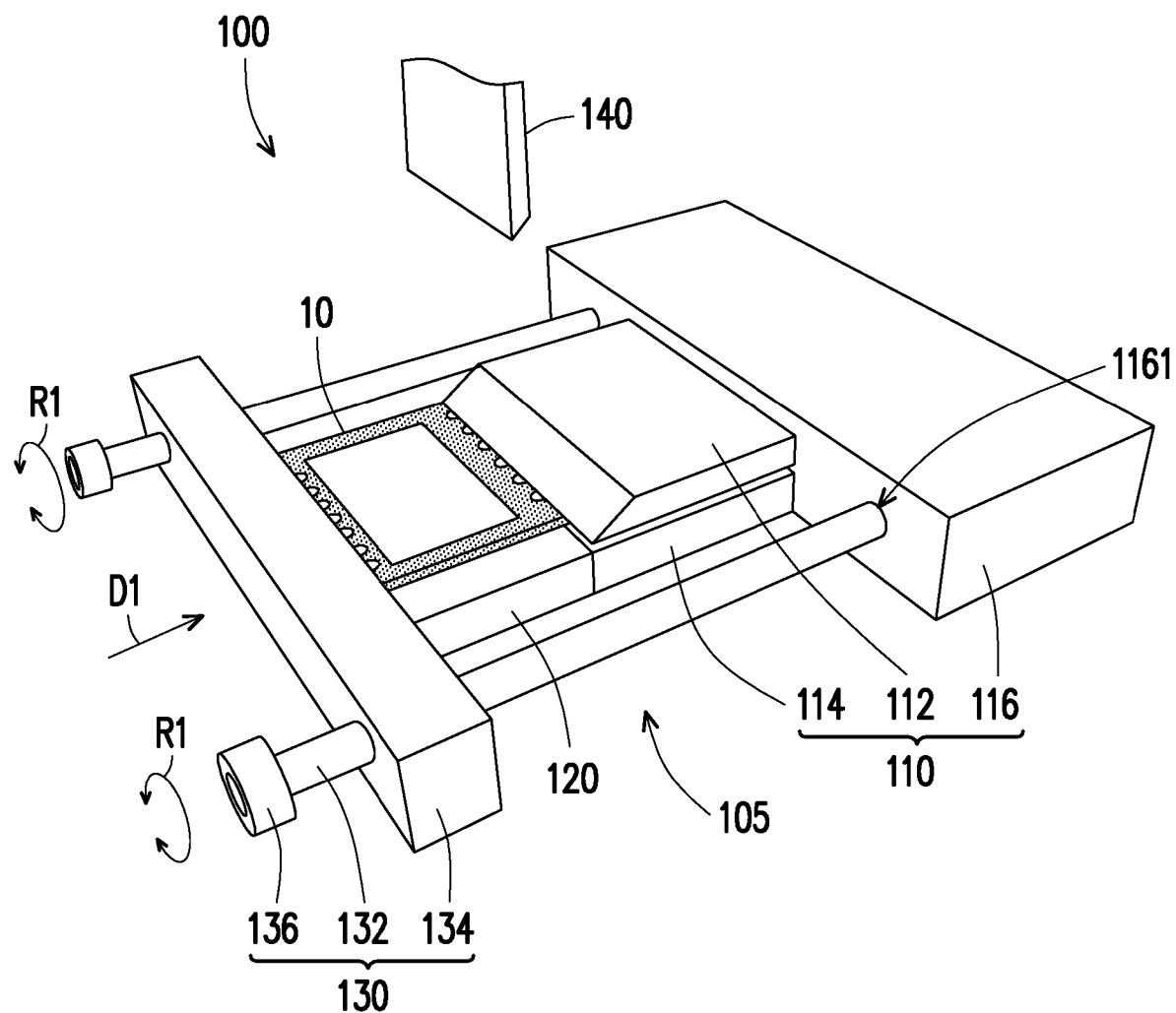
FIG. 1 illustrates a schematic view of a testing apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
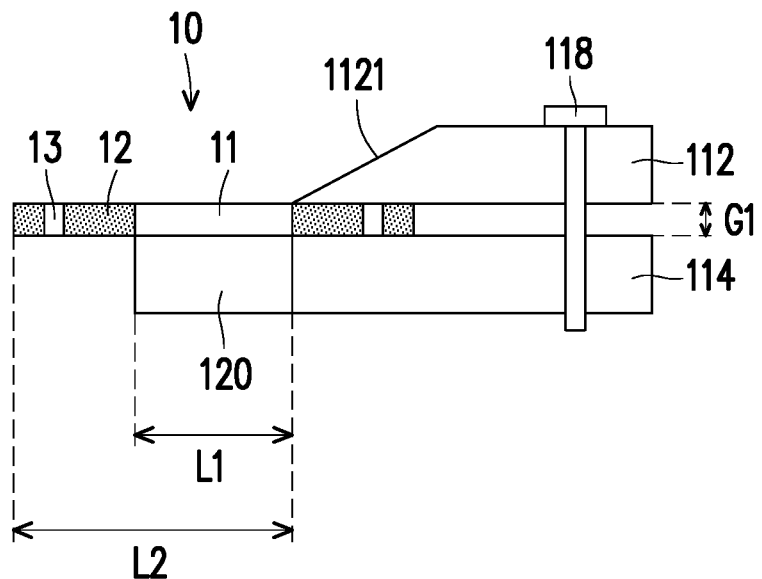
FIG. 2 illustrates a partial cross-sectional view of an alignment holder in accordance with some embodiments.

FIG. 1 illustrates a schematic view of a testing apparatus in accordance with some embodiments. FIG. 2 illustrates a partial cross-sectional view of an alignment holder in accordance with some embodiments. With now reference to FIG. 1 and FIG. 2, a testing apparatus 100 shown in FIG. 1 is configured to test a bonding strength of a composite specimen 10. In some embodiments, the composite specimen 10 may be a composite structure including multiple components bonding together, and the testing apparatus 100 is configured to test/measure the bonding strength between the components around interfaces thereof. In some embodiments, the composite specimen 10 may be a semiconductor package including a plurality of components (e.g. encapsulation materials, through vias, semiconductor devices, etc.) bonding with one another, such that the composite specimen 10 includes a plurality of bonding interfaces. The materials of the plurality of components may be different from one another. For example, the composite specimen 10 may include Integrated Fan Out (InFO) packages, Chip on Wafer on Substrate (CoWoS) packages, flip chip packages and other semiconductor packages.

In some embodiments, for example, the composite specimen 10 may be an encapsulated semiconductor device, which includes a semiconductor device 11 encapsulated by an encapsulating material 12, and a plurality of through vias (conductive pillars) 13 surrounding the semiconductor device 11 and extending through the encapsulating material 12 as shown in FIG. 1 and FIG. 2. The encapsulating material 12 reveals electrical terminals of the semiconductor device 11 and the end surfaces of the through vias 13. In the embodiments of the composite specimen 10 being the encapsulated semiconductor device, the composite specimen 10 may be in a wafer form. In some embodiments, the testing apparatus 100 are provided to test/measure the bonding strength (i.e. delamination durability) of the composite specimen (encapsulated semiconductor device) 10 at the bonding interfaces (e.g. bonding interfaces between the encapsulation material 12 and the through vias 13, bonding interfaces between encapsulation material 12 and the semiconductor device 11, etc.) thereof.

In some embodiments, the materials of the components in the composite specimen 10 may be different from one another. For example, the material of the encapsulating material 12 may include epoxy or other suitable resins. In some embodiments, the encapsulating material 12 may be epoxy resin containing chemical filler. The material of a substrate of the semiconductor device 11 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The material of the through vias 13 may include a copper (Cu) and/or a copper-based alloy, etc. In some embodiments, the materials of some components in the composite specimen 10 may be the same, and the testing apparatus 100 is also configured for testing the bonding strength between the components with the same materials.

In some embodiments, the testing apparatus 100 includes an alignment holder 105 for holding the composite specimen 10 and a force applying bar 140 for applying a force to the composite specimen 10. In some embodiments, the alignment holder 105 includes a holder body 110 and a positioning mechanism 130. The holder body 110 is configured to clamp a first side (e.g. right side) of the composite specimen 10. In one of the implementations, the holder body 110 may include an upper holder 112 and a lower holder 114, and the first side of the composite specimen 10 is configured to be disposed between the upper holder 112 and the lower holder 114. In some embodiments, the holder body 110 may further include a locking member 118. The locking member 118 is coupled between the upper holder 112 and the lower holder 114, and a distance G1 between the upper holder 112 and the lower holder 114 can be adjusted by the locking member 118. For instance, the locking member 118 can be a screw. The upper holder 112 and the lower holder 114 each has a threaded hole correspondingly. As such, the distance G1 between the upper holder 112 and the lower holder 114 can be adjusted according to how deep the locking member 118 is screwed into the threaded holes of the upper holder 112 and the lower holder 114.

Figure 3:
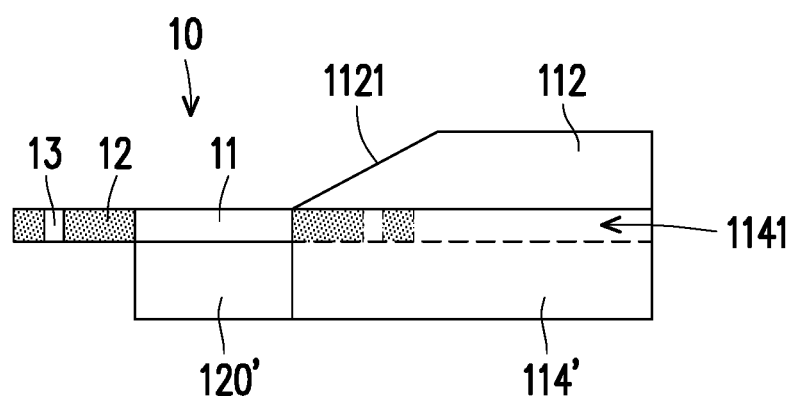
FIG. 3 illustrates a partial cross-sectional view of an alignment holder in accordance with some embodiments.
Figure 4:
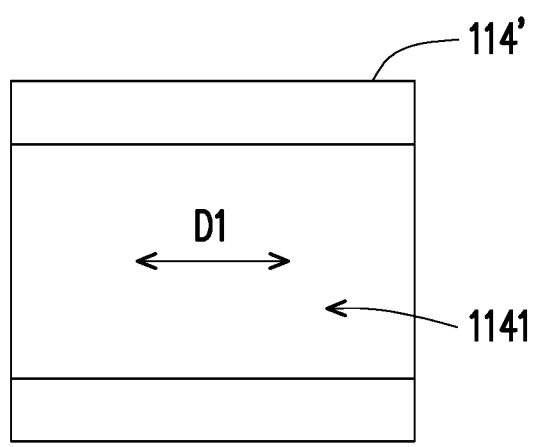
FIG. 4 illustrates a schematic top view of a lower holder of an alignment holder in accordance with some embodiments.

FIG. 3 illustrates a partial cross-sectional view of an alignment holder in accordance with some embodiments. FIG. 4 illustrates a schematic top view of a lower holder of an alignment holder in accordance with some embodiments. With now reference to FIG. 3 and FIG. 4, in some embodiments, the holder body 110 may further include a groove 1141 for receiving the composite specimen 10. In accordance with some embodiments of the disclosure, the groove 1141 crosses over the lower holder 114 as shown in FIG. 3 and FIG. 4, such that the composite specimen 10 is configured to be moved along a moving direction D1 within the groove 1141. In other words, the groove 1141 may be functioned as a sliding rail for the composite specimen 10 to slide relatively to the holder body along the groove 1141. With such arrangement, the upper holder 112 and the lower holder 114 may be in contact with each other when clamping the composite specimen 10. In other embodiments, the groove 1141 may be disposed on the upper holder 112 and/or the lower holder 114 to be functioned as the sliding rail for the composite specimen 10. The depth of the groove 1141 can be adjusted according to actual requirements, such as the thickness of the composite specimen 10, the configuration of the holder body 110, etc.

Figure 5:
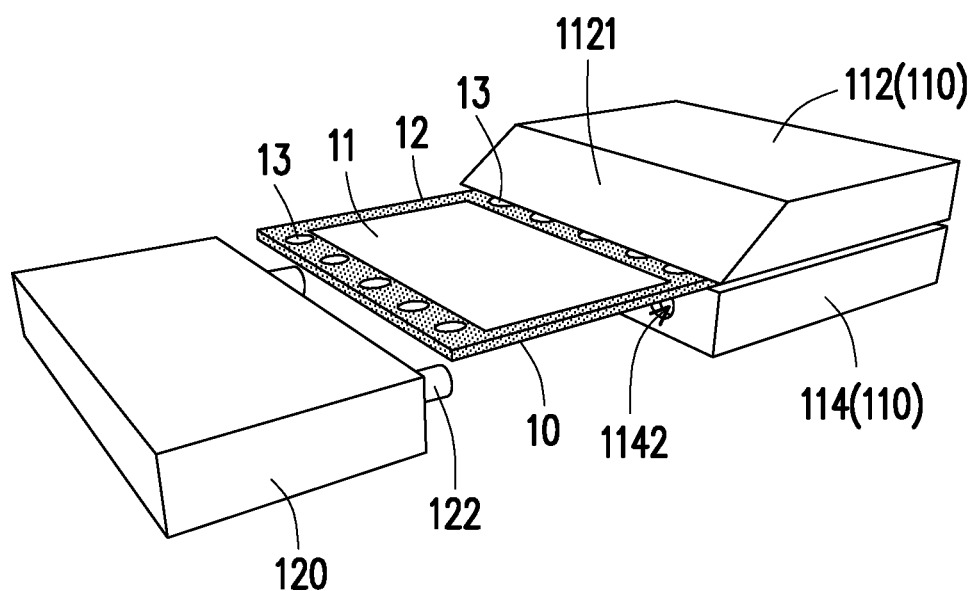
FIG. 5 illustrates a schematic view of an alignment holder in an intermediate stage of operation in accordance with some embodiments.

FIG. 5 illustrates a schematic view of an alignment holder in an intermediate stage of operation in accordance with some embodiments. With now reference to FIG. 1 and FIG. 5, in some embodiments, the alignment holder 105 may further include a supporter 120 detachably connected to a lower part of the holder body 110 for supporting a lower surface of the composite specimen 10. In some embodiments, the supporter 120 may be detachably connected to the lower holder 114. In accordance with some embodiments of the disclosure, the supporter 120 is detachably connected to the lower holder 114 through mechanical engagement. For example, the supporter 120 may include at least one protrusion (e.g. the protrusion 122 illustrated in in FIG. 5), and the lower holder 114 may correspondingly include at least one concave (e.g. the concave 1142 illustrated in in FIG. 5). With such arrangement, the supporter 120 can be detachably connected to the lower holder 114 through the engagement of the protrusion 122 of the supporter 120 and the concave 1142 of the lower holder 114, but the disclosure is not limited thereto. Any form of mechanical engagement or any suitable connections may be applied to the supporter 120 and the lower holder 114. In alternative embodiments, the supporter 120 may be detachably connected to the lower holder 114 through magnetic force. For example, the supporter 120 and the lower holder 114 may each include a magnetic component, and the magnetic components in the supporter 120 and the lower holder 114 are configured to be attracted to each other.

In some embodiments, the supporter 120 can be firstly attached (connected) to the lower holder 114 when the composite specimen 10 is placed between the upper holder 112 and the lower holder 114, so the lower surface of the composite specimen 10 can lean on the supporter 120 for holding and supporting the composite specimen 10 in place. Then, when the composite specimen 10 is adjusted to a desired clamping position, the distance G1 between the upper holder 112 and the lower holder 114 can be adjusted (shortened) by, for example, screwing the locking member 118 into the threaded holes of the upper holder 112 and the lower holder 114. That is to say, the tightness of the holder body 110 for clamping the composite specimen 10 can be controlled by the locking member 118, so as to hold the composite specimen 10 in place.

With now reference to FIG. 1, in some embodiments, the positioning mechanism 130 is configured to lean against a second side (e.g. left side) of the composite specimen 10 and move relatively to the holder body 110 for adjusting a clamping position of the composite specimen 10 clamped by the holder body 110. In some embodiments, the holder body 110 may further include a base 116. The upper holder 112 and the lower holder 114 are disposed on the base 116, and the positioning mechanism 130 is movably coupled to the base 116. In accordance with some embodiments of the disclosure, the positioning mechanism 130 includes at least one positioning rod 132 (two positioning rods 132 are illustrated herein, but not limited thereto) and a positioning plate 134 coupled to the positioning rod 132. Correspondingly, the base 116 includes at least one positioning hole 1161 (two positioning holes 1161 are illustrated herein, but not limited thereto), and the positioning rods 132 are movably engaged with the positioning holes 1161 respectively. The positioning plate 134 is configured to lean against a second side (e.g. left side) of the composite specimen 10 and move along with the positioning rod 132. For example, the positioning holes 1161 may be threaded holes, and the positioning rods 132 may be threaded rods. As such, one end of the positioning rod 132 may penetrate the positioning plate 134 and another end of the positioning rod 132 is screwed into the positioning holes 1161, so that the positioning rod 132 is configured to drive the positioning plate 134 to move toward or away from the holder body 110. In some embodiments, a nub 136 may be disposed on a cantilever end of each positioning rod 132 to facilitate the operation of the positioning rod 132.

With now reference to FIG. 2, in accordance with some embodiments of the disclosure, a length L1 of the supporter 120 is substantially shorter than a length L2 of the composite specimen 10 exposed by the upper holder 112 and the lower holder 114 of the holder body 110. Accordingly, the positioning mechanism 130 is capable of pushing the second side of the composite specimen 10 toward the holder body 110 without interfering with the supporter 120. In some embodiments, the positioning mechanism 130 is configured to lean against the second side of the composite specimen 10, which is opposite to the first side of the composite specimen 10 where the upper holder 112 and the lower holder 114 are clamped.

Figure 6:
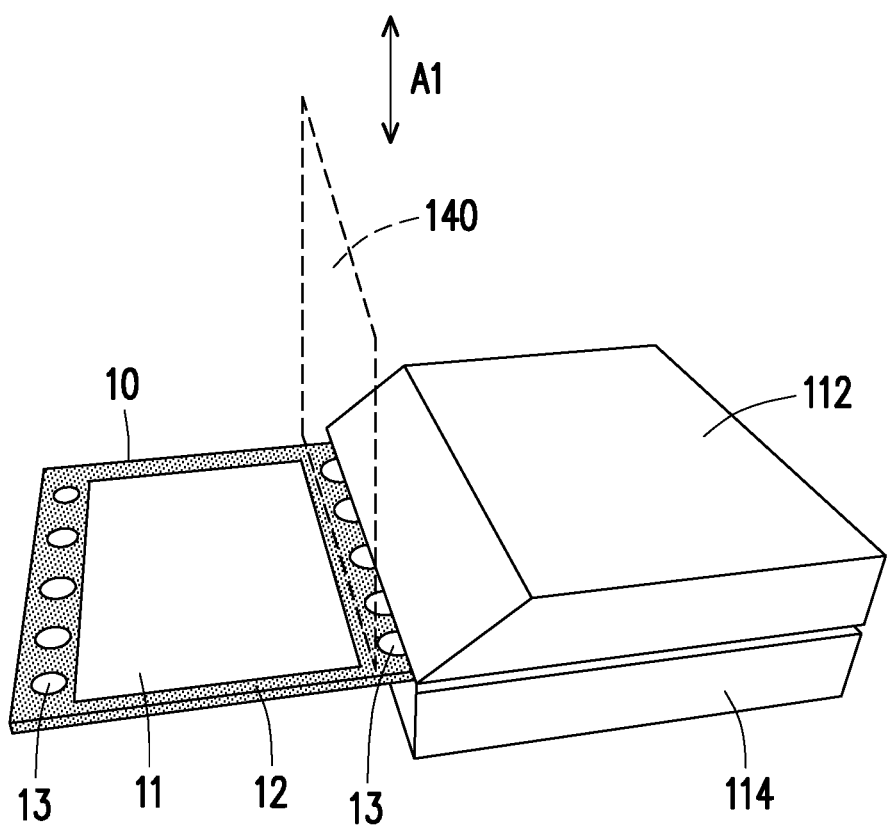
FIG. 6 illustrates a schematic view of a testing apparatus in a testing stage in accordance with some embodiments.

FIG. 6 illustrates a schematic view of a testing apparatus in a testing stage in accordance with some embodiments. With now reference to FIG. 1 and FIG. 6, with such arrangement, when a user want to adjust the clamping position of the composite specimen 10, the user may just simply rotate the nubs 136 along the rotating direction R1 to screw the positioning rods 132 into the positioning holes 1161. Accordingly, the positioning plate 134 is driven to move along with the positioning rods 132, and pushes the composite specimen 10 to move toward the holder body 110. When the composite specimen 10 is moved to a desired clamping position, the user just simply stops the rotation of the nub 136 and screws the locking member 118 further into the upper holder 112 and the lower holder 114 to lock the composite specimen 10 in place. Then, the positioning mechanism 130 may be removed by rotate the nub 136 conversely to unscrew the positioning rods 132 from the positioning holes 1161. The supporter 120 may also be removed by, for example, disengaging the supporter 120 from the lower holder 114. Then, a force may be applied to a part of the composite specimen 10 by a force applying bar 140 to test the bonding strength of the composite specimen 10. In some embodiments, the force applying bar 140 may be a cantilever beam. In some embodiments, the cantilever end of the force applying bar 140 is configured for abutment with an upper surface of the composite specimen 10 to apply force thereon. Therefore, the positioning and the alignment of the composite specimen 10 can be well controlled by the upper holder 112, the lower holder 114 and the positioning mechanism 130, and manual error and false test result caused by shift or misalignment of the composite specimen 10 can be avoided.

With now reference to FIG. 2, in accordance with some embodiments of the disclosure, the upper holder 112 includes an inclined surface 1121 at a tip of the upper holder 112 for aligning with the first side of the composite specimen 10. In some embodiments, the upper holder 112 may be a wedge block. With such arrangement, the view angle of the user would not be blocked by the upper edge of the upper holder 112, so the user may have better observation on the composite specimen 10 during the adjusting of the clamping position of the composite specimen 10.

In accordance with some embodiments of the disclosure, the force may be applied to an interface between two components of the composite specimen 10 by the force applying bar 140. In some embodiments, the force applying bar 140 is configured to move toward the composite specimen 10 along a direction perpendicular to a surface (e.g. an upper surface) of the composite specimen 10. For example, the force may be applied on an upper surface at the interface between the encapsulating material 12 and the semiconductor device 11 or the interface between the encapsulating material 12 and the through vias 13. Accordingly, the bonding strength between the encapsulating material 12 and the semiconductor device 11 and the bonding strength between the encapsulating material 12 and the through vias 13 can be tested/measured. As such, bonding strength (delamination durability) can be determined by measuring the applied force during an increment of delamination growth at the interface. With the application of the alignment holder 105, the clamping position can be well controlled to expose the interface to be tested without shifting, so the force can be applied to the interface of the composite specimen 10 precisely. For example, the composite specimen 10 is firstly clamped by the holder body 110, and then pushed toward the holder body 110 by the positioning mechanism 130 to adjust the clamping position more precisely, so as to avoid or reduce misalignment (position shifting) of the composite specimen 10 resulting from manual placement of the composite specimen 10. As such, accuracy of testing result of the testing apparatus 100 can be improved.

In accordance with some embodiments of the disclosure, for a bending test, the force applying bar 140 is moved along a direction from the upper holder 112 toward the lower holder 114 to apply a bending force toward the composite specimen 10. In some embodiments, a longitudinal axis A1 of the force applying bar 140 is substantially perpendicular to an applying surface (e.g. the upper surface) of the composite specimen 10, and the bending force is applied by the tip of the force applying bar 140 as it is shown in FIG. 6.

Figure 7:
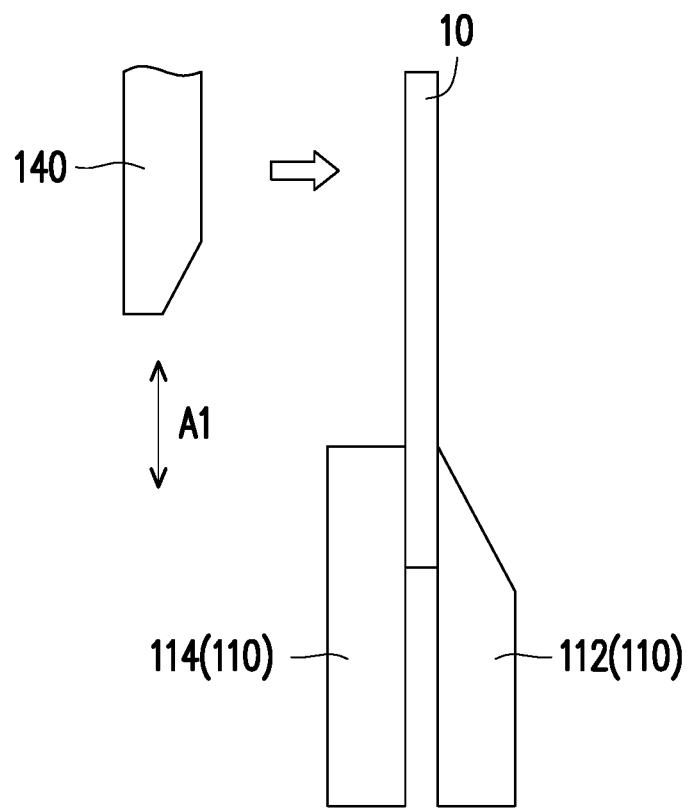
FIG. 7 illustrates a schematic view of a testing apparatus in a testing stage in accordance with some embodiments.

FIG. 7 illustrates a schematic view of a testing apparatus in a testing stage in accordance with some embodiments. With now reference to FIG. 7, in accordance with some embodiments of the disclosure, for a shear test, after the positioning mechanism 130 and the supporter 120 are removed, the holder body 110 can be placed in an upright position as it is shown in FIG. 7. As such, the composite specimen 10 clamped by the holder body 110 is also in an upright position. Accordingly, the longitudinal axis A1 of the force applying bar 140 is substantially parallel to an applying surface (e.g. lower surface) of the composite specimen 10, and the shear stress is applied by the side surface of the force applying bar 140 as it is shown in FIG. 7. In the embodiments of performing the shear test, the force applying bar 140 is moved along a direction from the lower holder 114 toward the upper holder 112 to apply a shear stress toward the composite specimen 10. Therefore, the alignment holder 105 provides the testing apparatus 100 more precision in alignment and more flexibility in operation of tests. With such arrangement, the alignment holder 105 and the testing apparatus 100 having the alignment holder 105 are capable of performing a bending test, a shear test, a scratch test, an indent test, or any other suitable tests that includes alignment and force application. Therefore, the application of the testing apparatus 100 having the alignment holder 105 is more versatile and the alignment of the composite specimen 10 and the testing result can be more precise.

In accordance with some embodiments of the disclosure, the composite specimen 10' may be an encapsulated semiconductor device, which includes a first semiconductor device 11, a second semiconductor device 14, a first encapsulating material 12a, and a second encapsulating material 12b. In some embodiments, the first semiconductor device 11 is encapsulated by the first encapsulating material 12a, and the second semiconductor device 14 is encapsulated by the second encapsulating material 12b. The first encapsulating material 12a and the second encapsulating material 12b are bonded with each other. In some embodiments, the structure of the first semiconductor device 11 encapsulated by the first encapsulating material 12a, and the structure of the second semiconductor device 14 encapsulated by the second encapsulating material 12b may be formed in separate steps.

For example, the structure of the first semiconductor device 11 encapsulated by the first encapsulating material 12a may be pre-formed and provided, and the second encapsulating material 12b is then formed to encapsulate the second semiconductor device 14 and bonding with the first encapsulating material 12a. In some embodiments, the first encapsulating material 12a and the second encapsulating material 12b may be over molding to cover the first semiconductor device 11 and the second semiconductor device 14. Then, a planarizing process may be performed on the first encapsulating material 12a and the second encapsulating material 12b to reveal the first semiconductor device 11 and the second semiconductor device 14. The planarizing process may include mechanical grinding or chemical mechanical polishing (CMP), for example. After the grinding process, a cleaning step may be optionally performed, for example, to clean and remove the residue generated from the grinding step. However, the disclosure is not limited thereto, and the planarizing step may be performed through any other suitable method.

With such arrangement, the force may be applied to the interface between the first semiconductor device 11 and the first encapsulating material 12a, the interface between the second semiconductor device 14 and the second encapsulating material 12b, and the interface between the first encapsulating material 12a and the second encapsulating material 12b to test the bonding strength thereof. In some embodiments, the materials of the first encapsulating material 12a and the second encapsulating material 12b may be the same. For example, the material of the first encapsulating material 12a and the second encapsulating material 12b may include epoxy or other suitable resins. In some embodiments, the first encapsulating material 12a and the second encapsulating material 12b may be epoxy resin containing chemical filler. In alternative embodiments, the materials of the first encapsulating material 12a and the second encapsulating material 12b may be different from each other. The first semiconductor device 11 and/or the second semiconductor device 14 may be high bandwidth memory (HBM) dies, or any other suitable semiconductor devices. In some embodiments, at least one of the first semiconductor device 11 and the second semiconductor device 14 may be a dummy die merely for testing purpose, so as to further reduce the cost for testing.

Figure 8:
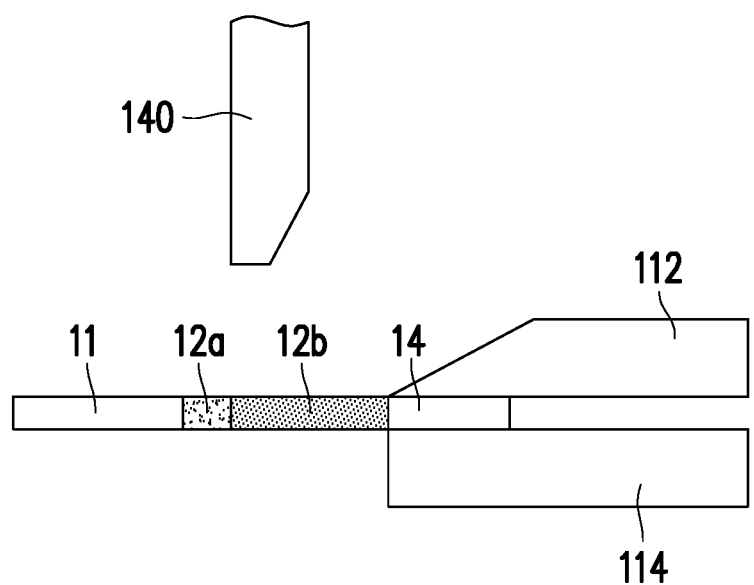
FIG. 8 illustrates a partial cross-sectional view of an alignment holder in accordance with some embodiments.

In accordance with some embodiments of the disclosure, for a bending test, the force applying bar 140 can be moved along a direction from the upper holder 112 toward the lower holder 114 to apply a bending force toward the composite specimen 10. In some embodiments, the longitudinal axis of the force applying bar 140 is substantially perpendicular to an applying surface (e.g. the upper surface) of the composite specimen 10', and the bending force is applied by the tip of the force applying bar 140 as it is shown in FIG. 8.

Figure 9:
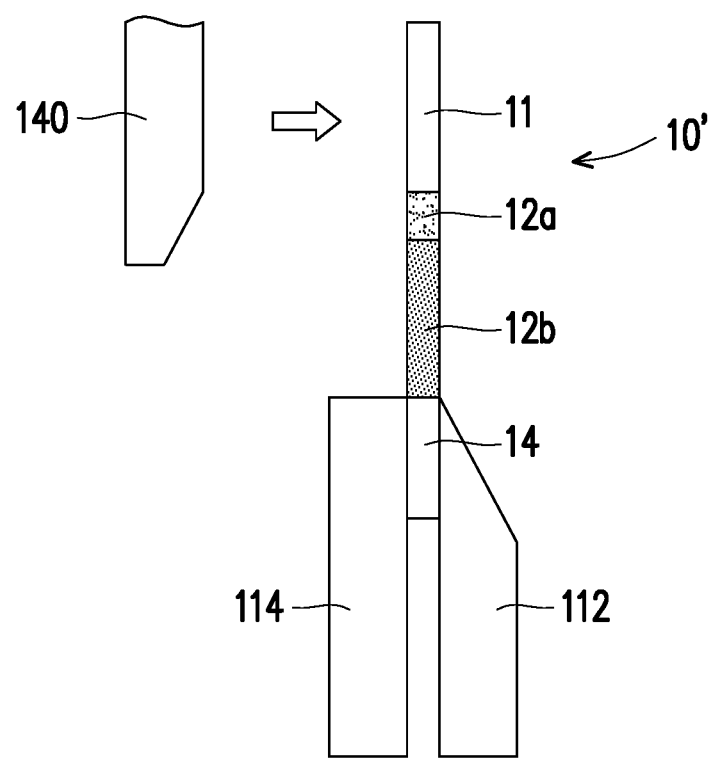
FIG. 9 illustrates a schematic view of a testing apparatus in a testing stage in accordance with some embodiments.

FIG. 9 illustrates a schematic view of a testing apparatus in a testing stage in accordance with some embodiments. With now reference to FIG. 9, in accordance with some embodiments of the disclosure, for a shear test, after the positioning mechanism 130 and the supporter 120 are removed, the holder body 110 can be placed in an upright position as it is shown in FIG. 9. As such, the composite specimen 10' clamped by the holder body 110 is also in an upright position. Accordingly, the longitudinal axis of the force applying bar 140 is substantially parallel to an applying surface (e.g. lower surface) of the composite specimen 10', and the shear stress is applied by the side surface of the force applying bar 140 as it is shown in FIG. 9. In the embodiments of performing the shear test, the force applying bar 140 is moved along a direction from the lower holder 114 toward the upper holder 112 to apply a shear stress toward the composite specimen 10'. In general, the composite specimen 10' including the first encapsulating material 12a and the second encapsulating material 12b bonding with each other is easily to crack at the lower surface of the composite specimen 10' when subjected to high residual stress due to, for example, cure shrinkage of the encapsulating materials 12a, 12b. Therefore, the shear test as it is shown in FIG. 9 is inevitable for the composite specimen 10'.

In accordance with some embodiments of the disclosure, the alignment holder 105 provides the testing apparatus 100 more precision in alignment and more flexibility in operation of tests. With such arrangement, the alignment holder 105 and the testing apparatus 100 having the alignment holder 105 are capable of performing a bending test, a shear test, a scratch test, an indent test, or any other suitable tests that includes alignment and force application.

Figure 10:
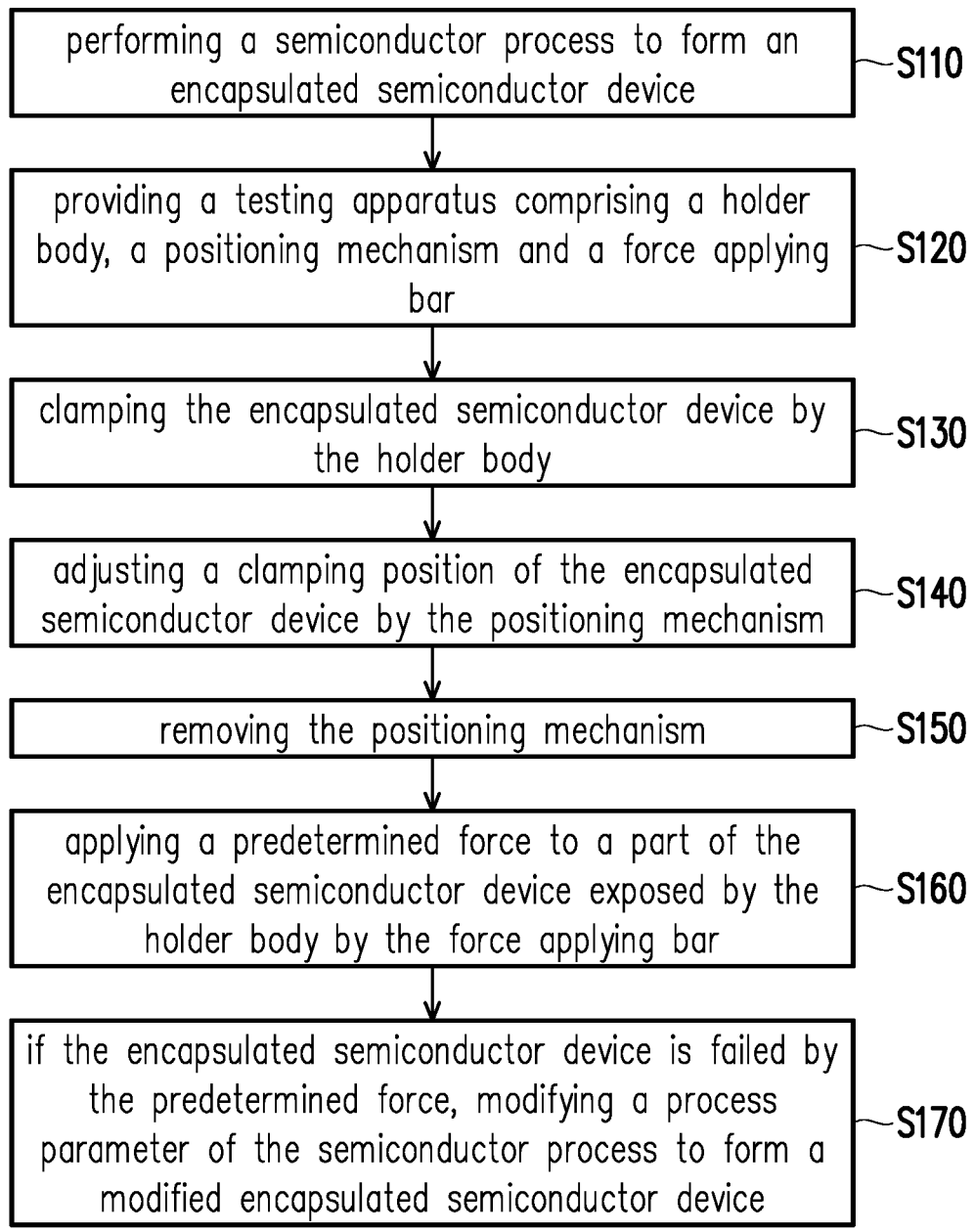
FIG. 10 illustrates a block diagram of a method for manufacturing a semiconductor package in accordance with some embodiments.
Figure 11:
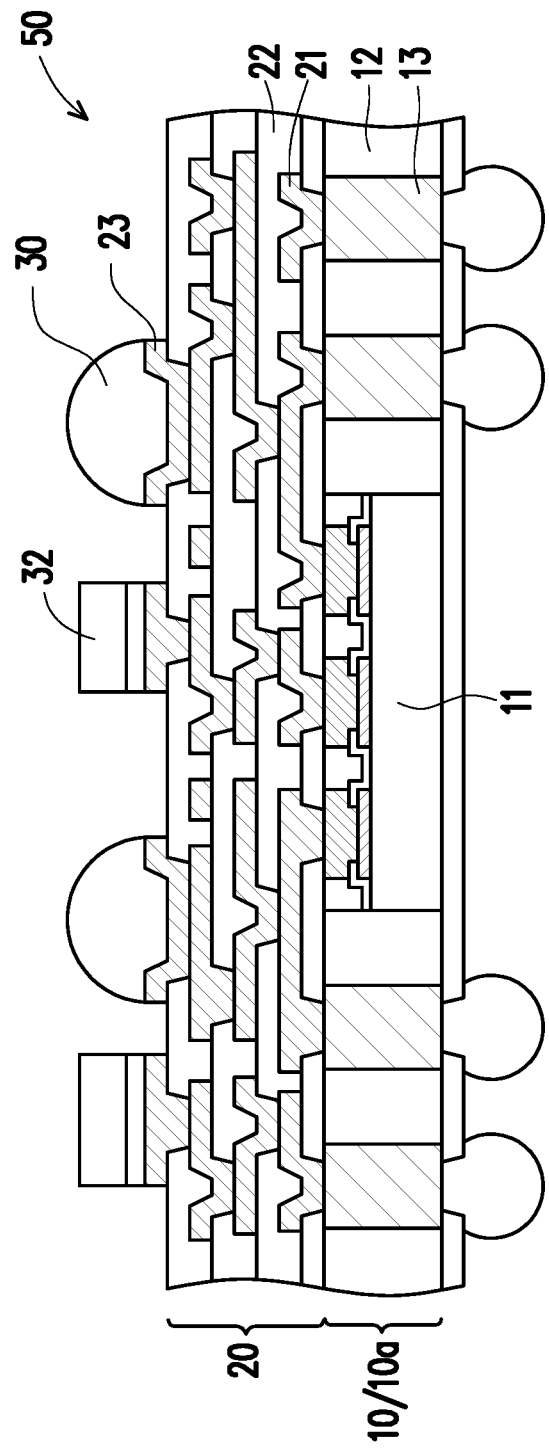
FIG. 11 illustrates a cross-sectional view of a semiconductor package in accordance with some embodiments.

With now reference to FIG. 1, FIG. 10 and FIG. 11, in accordance with some embodiments of the disclosure, the method for manufacturing a semiconductor package 50 as shown in FIG. 11 may include the following steps. It is noted that the following description is illustrated regarding the embodiment of the method is applied to the composite specimen (encapsulated semiconductor device) 10 shown in FIG. 1, but the disclosure is not limited thereto. It should be understood that the method and the testing apparatus 100 might also be applied to any suitable specimens.

First, performing step S110, an encapsulated semiconductor device 10 including an encapsulating material 12 and a semiconductor device 11 encapsulated by the encapsulating material 12 is provided. In some embodiments, the encapsulated semiconductor device 10 is formed by a semiconductor process. Such semiconductor process may include providing a semiconductor device 11 and a plurality of through vias (conductive pillars) 13 and then providing an encapsulating material 12 to encapsulate the semiconductor device 11 and the conductive pillars 13. In some embodiments, the semiconductor device 11 and the through vias (conductive pillars) 13 may be provided on a carrier (not shown), and the carrier may be removed during the sequential testing process. In some embodiments, the carrier may be a glass carrier, a ceramic carrier, or the like. The conductive pillars 13 may be pre-formed, and are then placed on the carrier. In alternative embodiments, the conductive pillars 13 may be formed by, for example, plating process. The plating of the conductive pillars 130 may be performed before the placement of the semiconductor device 11. In some embodiments, the encapsulating material 12 may include a molding compound, an epoxy, or a resin, etc. In some embodiments, a thinning process, which may be a grinding process, may be optionally performed to thin the encapsulating material 12 for revealing the through vias 13 and electrical terminals of the semiconductor device 11.

Then, performing step S120, a testing apparatus 100 including a holder body 110, a positioning mechanism 130 and a force applying bar 140 as it is shown in FIG. 1 is provided. The testing apparatus 100 is provided to test/measure the bonding strength (i.e. delamination durability) of the encapsulated semiconductor device 10 at the bonding interfaces (e.g. bonding interfaces between the encapsulation material 12 and the through vias 13, bonding interfaces between encapsulation material 12 and the semiconductor device 11, etc.) thereof.

Then, performing step S130, a first side of the encapsulated semiconductor device (composite specimen) 10 is clamped by the holder body 110. In some embodiments, the first side (e.g. the right side) of the encapsulated semiconductor device 10 is placed between the upper holder 112 and the lower holder 114 of the holder body 110. In the embodiments of the testing apparatus 100 having a stopper 120 shown in FIG. 1, the supporter 120 can be firstly attached (connected) to the lower holder 114 before the encapsulated semiconductor device 10 is placed between the upper holder 112 and the lower holder 114. Thereby, the lower surface of the encapsulated semiconductor device 10 can lean on the supporter 120 for holding and supporting the encapsulated semiconductor device 10 in place. In some embodiments, the supporter 120 can be detachably connected to the lower holder 114 by mechanical engagement, magnetic force, or any suitable means.

Then, performing step S140, the clamping position of the encapsulated semiconductor device 10 is adjusted by the positioning mechanism 130. For example, in some embodiments, a second side of the encapsulated semiconductor device 10 is pushed toward the holder body 110 by the positioning mechanism 130 for adjusting the clamping position of the encapsulated semiconductor device 10. In some embodiments, the positioning mechanism 130 leans against the second side (e.g. left side) of the encapsulated semiconductor device 10 opposite to the first side where the holder body 110 is clamped, and configured to pushes the second side of the encapsulated semiconductor device 10 toward the holder body 110 in a controllable way. When the encapsulated semiconductor device 10 is pushed and adjusted to a desired clamping position, the upper holder 112 and the lower holder 114 can be locked by, for example, screwing the locking member 118 into the threaded holes of the upper holder 112 and the lower holder 114. That is to say, the tightness of the holder body 110 for clamping the encapsulated semiconductor device 10 can be controlled by the locking member 118, so as to hold the encapsulated semiconductor device 10 in place. In other embodiments, the upper holder 112 and the lower holder 114 can be connected by an elastic piece, so as to clamp the encapsulated semiconductor device 10 in place.

Then, performing step S150, the positioning mechanism 130 may be removed. In some embodiments, the positioning mechanism 130 may be removed from the holder body by, for example, unscrewing the positioning rods 132 of the positioning mechanism 130 from the positioning holes 1161 of the holder body. In the embodiments of the testing apparatus 100 having the supporter 120, the supporter 120 may also be removed by, for example, disengaging the supporter 120 from the lower holder 114.

Then, performing step S160, a predetermined force may be applied to a part of the encapsulated semiconductor device 10 by a force applying bar 140 to test the bonding strength of the encapsulated semiconductor device 10. In some embodiments, the force may be applied to an interface between two bonding components of the encapsulated semiconductor device 10 by the force applying bar 140. For example, the predetermined force may be applied at the interface between the encapsulating material 12 and the semiconductor device 11 or the interface between the encapsulating material 12 and the through vias 13. Accordingly, the bonding strength between the encapsulating material 12 and the semiconductor device 11 and the bonding strength between the encapsulating material 12 and the through vias 13 can be tested and measured. With the application of the alignment holder 105, the alignment holder 105 can be well controlled to hold the encapsulated semiconductor device 10 and expose the interface to be tested, so the force can be applied to the interface of the encapsulated semiconductor device 10 precisely without shifting. Accordingly, the positioning and the alignment of the encapsulated semiconductor device 10 can be well controlled by the upper holder 112, the lower holder 114 and the positioning mechanism 130, and manual error and false test result caused by shift or misalignment of the encapsulated semiconductor device 10 can be avoided.

Then, performing step S160, if the encapsulated semiconductor device 10 is failed by the predetermined force applied by the force applying bar 140, a process parameter of the semiconductor process is modified to form a modified encapsulated semiconductor device 10a. In some embodiments, if the bonding strength between the interfaces of the encapsulated semiconductor device 10 does not meet the requirement, when the predetermined force is applied onto the encapsulated semiconductor device 10 by the force applying bar 140, the encapsulated semiconductor device 10 may fail (e.g. crack, or deform, etc.) around the interfaces. As such, process parameters of the semiconductor process for forming the encapsulated semiconductor device 10 may be modified to form the modified encapsulated semiconductor device 10a. For example, process parameters may include curing temperature of the encapsulating material 12, reactant concentrations of plating process for forming the conductive pillars 13 and/or conductors of the semiconductor device 11, etc. The testing process may be repeated until the bonding strength of the modified encapsulated semiconductor device meets the requirement, and then sequential process (e.g. forming a redistribution structure 20 over the modified encapsulated semiconductor device 10a, etc.) may be performed on the modified encapsulated semiconductor device to form the semiconductor package 50. Certainly, if the bonding strength of the encapsulated semiconductor device 10 meets the requirement in the first place, the sequential process (e.g. forming a redistribution structure 20 over the encapsulated semiconductor device 10, etc.) may be performed on the encapsulated semiconductor device 10 to form the semiconductor package 50 without modifying any process parameters.

In some embodiments, for the sequential process, the redistribution structure 20 may be formed over the encapsulating material 12 and the semiconductor device 11 and electrically connected to the semiconductor device 11 and the through vias 13 of the encapsulated semiconductor device 10/10a. The redistribution structure 140 may be formed by, for example, depositing conductive layers, patterning the conductive layers to form redistribution circuits 21, partially covering the redistribution circuits 21 and filling the gaps between the redistribution circuits 21 with dielectric layers 22, etc. The material of the redistribution circuits 21 may include a metal or a metal alloy including aluminum, copper, tungsten, and/or alloys thereof. The dielectric layers 22 may be formed of dielectric materials such as oxides, nitrides, carbides, carbon nitrides, combinations thereof, and/or multi-layers thereof. The redistribution circuits 21 are formed in the dielectric layers 22 and electrically connected to the semiconductor device 11 and the through vias 13. In addition, an Under Bump Metallurgy (UBM) layer 23 may be formed on the redistribution structure 20 by sputtering, evaporation, or electroless plating, etc.

Then, a plurality of electrical connectors 30 and at least one Integrated Passive Device (IPD) 32 are disposed on the redistribution structure 20 in accordance with some exemplary embodiments. The formation of the electrical connectors 30 may include placing solder balls on the UBM layer 23 (or on the redistribution structure 20), and then reflowing the solder balls. In alternative embodiments, the formation of the electrical connectors 30 may include performing a plating process to form solder regions on the UBM layer 23 (or on the redistribution structure 20), and then reflowing the solder regions. The electrical connectors 30 may also include conductive pillars, or conductive pillars with solder caps, which may also be formed through plating. The IPD 32 may be fabricated using standard wafer fabrication technologies such as thin film and photolithography processing, and may be mounted on the redistribution structure 20 through, for example, flip-chip bonding or wire bonding, etc.

In accordance with some embodiments of the disclosure, the method and the testing apparatus for testing the bonding strength of the encapsulated semiconductor device 10 can be applied once the encapsulating material 12 is formed (i.e. molding process). In other words, the delamination durability of the encapsulated semiconductor device 10 can be obtained once the molding process is performed instead of waiting until the whole semiconductor package process is finished. That is to say, the testing method and the testing apparatus can be applied to the encapsulated semiconductor device 10 instead of being applied to the semiconductor package, which may include the encapsulated semiconductor device, and redistribution structure, etc. Thereby, the delamination durability of the encapsulated semiconductor device 10 can be obtained more instantaneously, so as to modify recipe of the encapsulated semiconductor device 10 to prevent the risk of delamination immediately rather than having to wait until the whole semiconductor package process is finished. Therefore, the product cost can be reduced and the process efficiency can be improved.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, an alignment holder for holding a composite specimen includes a holder body, a supporter, and a positioning mechanism. The holder body is configured to clamp a first side of the composite specimen. The supporter is detachably connected to a lower part of the holder body for supporting a lower surface of the composite specimen. The positioning mechanism is configured to lean against a second side of the composite specimen and move relatively to the holder body for adjusting a clamping position of the composite specimen clamped by the holder body.

In accordance with some embodiments of the disclosure, a testing apparatus for testing a bonding strength of a composite specimen includes a holder body, a positioning mechanism, and a force applying bar. The holder body is configured to clamp a first side of the composite specimen. The positioning mechanism is movably coupled to the holder body, wherein the positioning mechanism is configured to lean against a second side of the composite specimen and move relatively to the holder body for adjusting a clamping position of the composite specimen clamped by the holder body. The force applying bar is configured to apply a force to a part of the composite specimen exposed by the holder body.

In accordance with some embodiments of the disclosure, a method for manufacturing a semiconductor package includes the following steps. A semiconductor process is performed to form an encapsulated semiconductor device, wherein the encapsulated semiconductor device comprises an encapsulating material and a semiconductor device encapsulated by the encapsulating material. A testing apparatus including a holder body, a positioning mechanism and a force applying bar is provided. The encapsulated semiconductor device is clamped by the holder body. A clamping position of the encapsulated semiconductor device is adjusted by the positioning mechanism. The positioning mechanism is removed. A predetermined force is applied to a part of the encapsulated semiconductor device exposed by the holder body by the force applying bar. If the encapsulated semiconductor device is failed by the predetermined force, a process parameter of the semiconductor process is modified to form a modified encapsulated semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An alignment holder for holding a composite specimen, comprising: a holder body configured to clamp a first side of the composite specimen; a supporter detachably connected to a lower part of the holder body for supporting a lower surface of the composite specimen; and a positioning mechanism configured to lean against a second side of the composite specimen and move relatively to the holder body for adjusting a clamping position of the composite specimen clamped by the holder body, wherein the holder body comprises an upper holder and a lower holder, and the first side of the composite specimen is configured to be disposed between the upper holder and the lower holder.

2. The alignment holder as claimed in claim 1, wherein the holder body further comprises a locking member coupled between the upper holder and the lower holder, and a distance between the upper holder and the lower holder is adjusted by the locking member.

3. The alignment holder as claimed in claim 1, wherein the upper holder comprises an inclined surface at a tip of the upper holder for aligning with the first side of the composite specimen.

4. The alignment holder as claimed in claim 1, wherein the holder body further comprises a base, and the positioning mechanism is movably coupled to the base.

5. The alignment holder as claimed in claim 4, wherein the base comprises at least one positioning hole, the positioning mechanism comprises at least one positioning rod movably engaged with the positioning hole and a positioning plate configured to lean against the second side of the composite specimen and move along with the positioning rod.

6. The alignment holder as claimed in claim 1, wherein a length of the supporter is substantially shorter than a length of the composite specimen exposed by the holder body.

7. The alignment holder as claimed in claim 1, wherein the holder body comprises a groove for receiving the composite specimen and the composite specimen is configured to be moved along the groove.

8. A testing apparatus for testing a bonding strength of a composite specimen, comprising: a holder body configured to clamp a first side of the composite specimen; a positioning mechanism movably coupled to the holder body, wherein the positioning mechanism is configured to lean against a second side of the composite specimen and move relatively to the holder body for adjusting a clamping position of the composite specimen clamped by the holder body; and a force applying bar configured to apply a force to a part of the composite specimen exposed by the holder body, wherein the holder body comprises an upper holder and a lower holder, and the first side of the composite specimen is configured to be disposed between the upper holder and the lower holder.

9. The testing apparatus as claimed in claim 8, wherein the holder body further comprises a locking member coupled between the upper holder and the lower holder, and a distance between the upper holder and the lower holder is adjusted by the locking member.

10. The testing apparatus as claimed in claim 8, further comprising a supporter detachably connected to the lower holder for supporting a lower surface of the composite specimen.

11. The testing apparatus as claimed in claim 8, wherein the upper holder comprises an inclined surface at a tip of the upper holder for aligning with the first side of the composite specimen.

12. The testing apparatus as claimed in claim 8, wherein the holder body further comprises a base, and the positioning mechanism is movably coupled to the base.

13. The testing apparatus as claimed in claim 12, wherein the base comprises at least one positioning hole, the positioning mechanism comprises at least one positioning rod movably engaged with the positioning hole and a positioning plate configured to lean against the second side of the composite specimen and move along with the positioning rod.

14. The testing apparatus as claimed in claim 8, wherein the holder body comprises a groove for receiving the composite specimen and the composite specimen is configured to be moved along the groove.

15. The testing apparatus as claimed in claim 8, wherein the force applying bar is configured to move toward the composite specimen along a direction perpendicular to a surface of the composite specimen.

* * * * *